US008000915B2

(12) United States Patent
Furukawa et al.

(10) Patent No.: US 8,000,915 B2
(45) Date of Patent: Aug. 16, 2011

(54) METHOD FOR ESTIMATING STATE OF CHARGE OF A RECHARGEABLE BATTERY

(75) Inventors: Tatsuya Furukawa, Okazaki (JP); Naoto Sato, Kosai (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 291 days.

(21) Appl. No.: 12/426,580

(22) Filed: Apr. 20, 2009

(65) Prior Publication Data
US 2009/0271132 A1 Oct. 29, 2009

(30) Foreign Application Priority Data

Apr. 25, 2008 (JP) .................. 2008-115642

(51) Int. Cl.
*G01R 31/36* (2006.01)
(52) U.S. Cl. .................................. 702/63
(58) Field of Classification Search ............... 702/63
See application file for complete search history.

(56) References Cited

U.S. PATENT DOCUMENTS
7,630,842 B2 * 12/2009 Murakami .............. 702/64

FOREIGN PATENT DOCUMENTS
JP  2003-197275  7/2003
JP  2007-292648  11/2007

* cited by examiner

*Primary Examiner* — Drew A Dunn
*Assistant Examiner* — Stephen J Cherry
(74) *Attorney, Agent, or Firm* — Workman Nydegger

(57) ABSTRACT

An apparatus for accurately estimating the SOC of a rechargeable battery installed in a hybrid electric vehicle. A voltage variation measurement unit measures terminal voltage variation amount of the rechargeable battery in a no-battery-current state in which a charge-discharge current does not flow in the rechargeable battery. A polarization voltage calculator calculates a polarization voltage from the measured variation amount. An electromotive force calculator subtracts the polarization voltage from a non-load voltage in a state in which a charge-discharge path is open to calculate the electromotive force of the rechargeable battery. An SOC estimator estimates the SOC of the rechargeable battery based on the electromotive force.

9 Claims, 6 Drawing Sheets

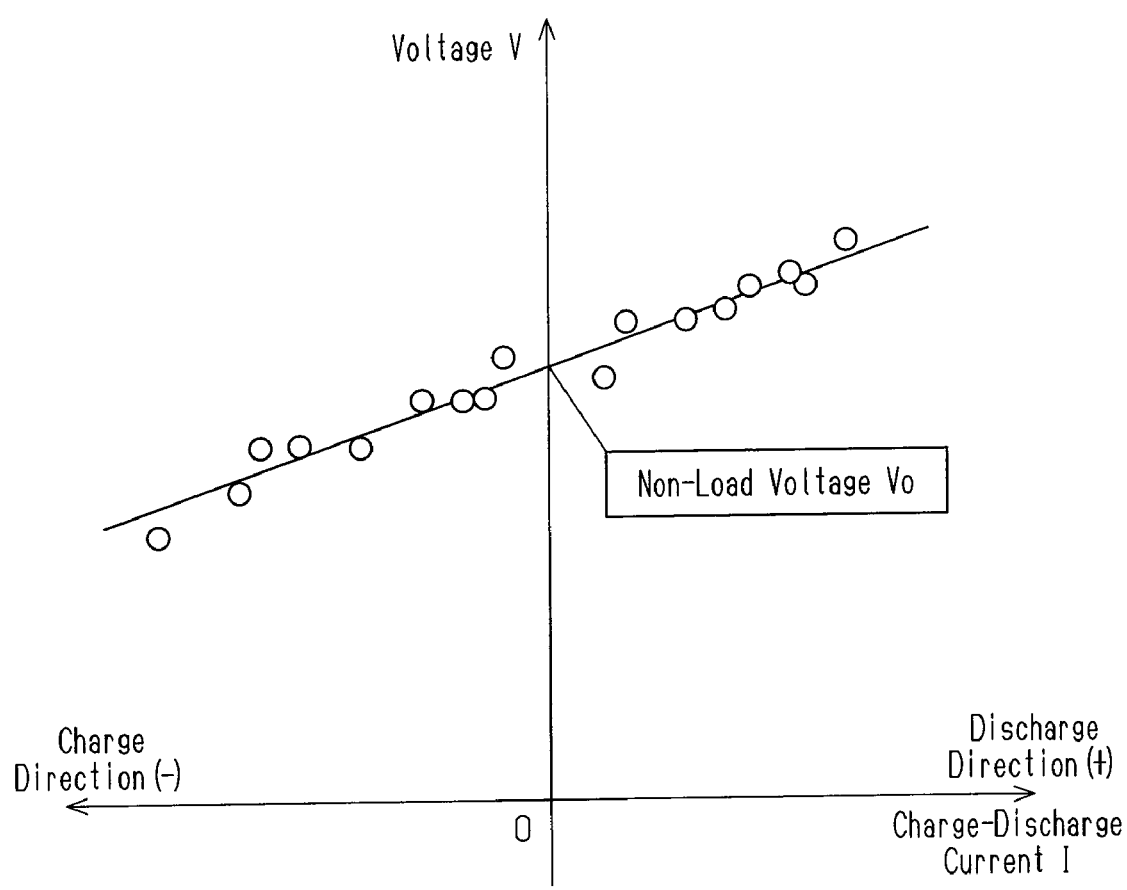

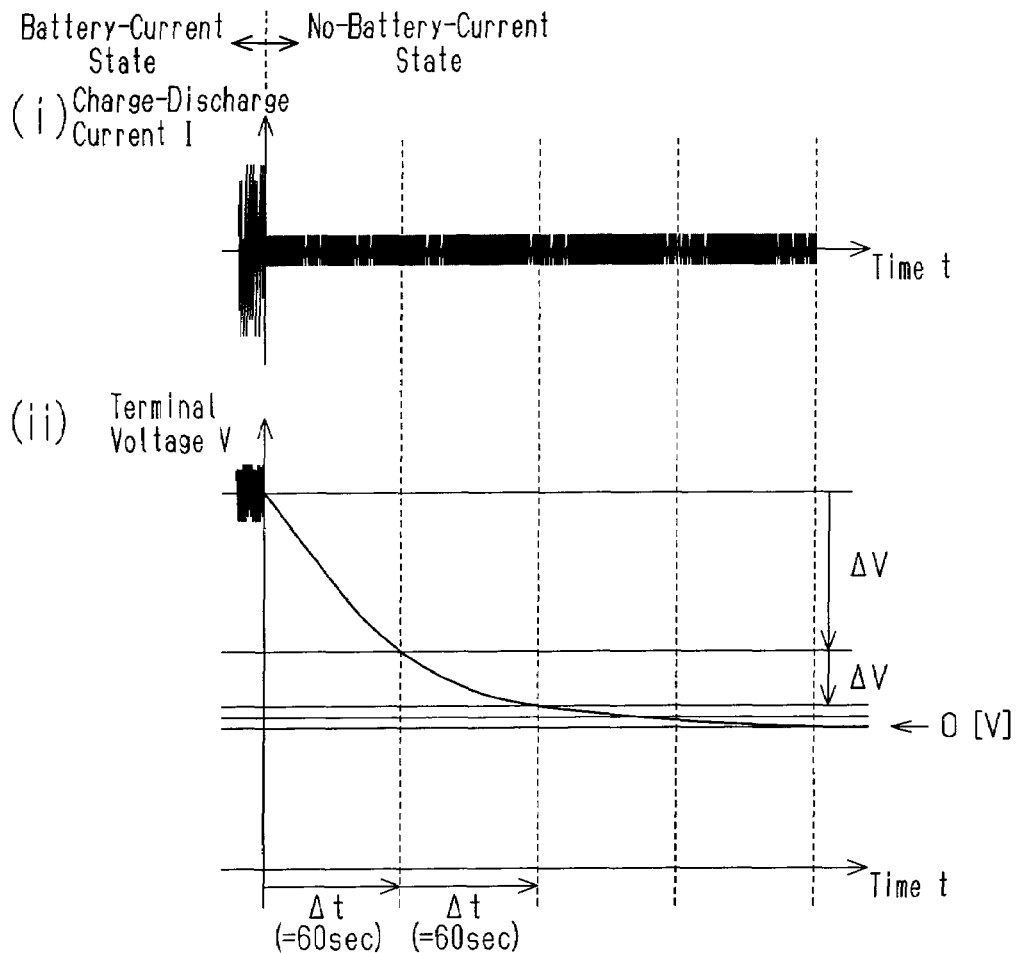
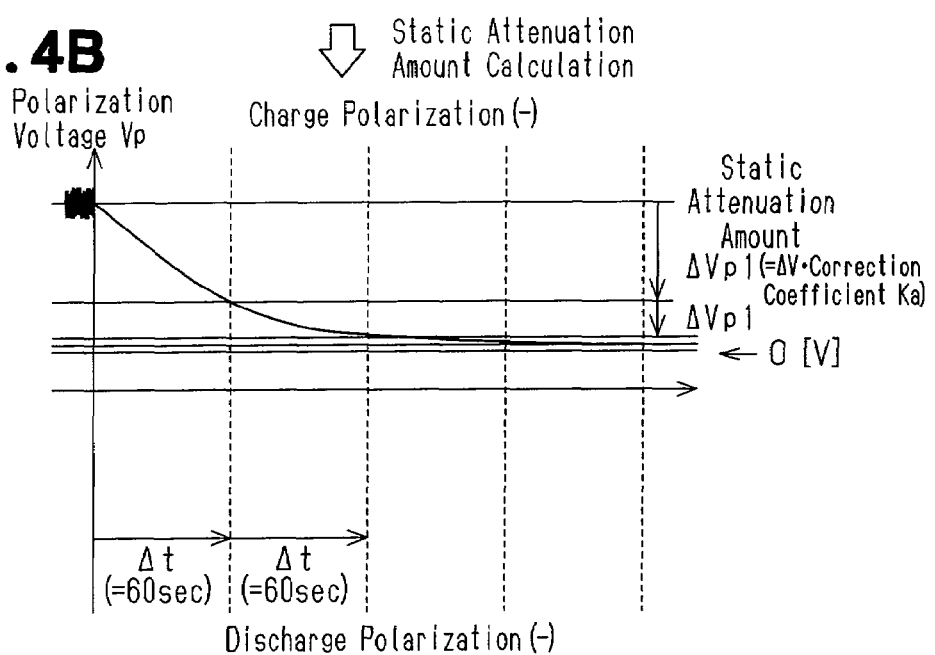

METHOD FOR ESTIMATING STATE OF CHARGE OF A RECHARGEABLE BATTERY

CROSS-REFERENCE TO RELATED APPLICATIONS

This application is based upon and claims the benefit of priority from the prior Japanese Patent Application No. 2008-115642, filed on Apr. 25, 2008, the entire contents of which are incorporated herein by reference.

BACKGROUND OF THE INVENTION

The present invention relates to a method and apparatus for estimating the state of charge of a rechargeable battery.

A rechargeable battery as a power source for a motor and as a drive source for various types of loads is applicable for use in a pure electric vehicle (PEV), a hybrid electric vehicle (HEV), and the like.

In a hybrid electric vehicle (HEV), when the engine output is more than necessary for driving the vehicle, surplus power is used to drive a generator and charge a rechargeable battery (e.g., nickel-metal hydride (NiMH) battery). On the other hand, when the engine output is low, the electric power of the rechargeable battery is used to drive a motor and assist the engine. In such a case, the rechargeable battery is discharged. Accordingly, in an HEV, the charging and discharging of the rechargeable battery must be controlled to maintain the rechargeable battery in a proper operational state.

Japanese Laid-Open Patent Publication No. 2007-292648 describes a controller that optimizes the fuel consumption efficiency of an HEV by estimating the state of charge (hereinafter referred to as the "SOC") of a rechargeable battery with a control program using detection data related to the rechargeable battery such as the charge-discharge current I, the terminal voltage V, and the temperature T. The controller controls the SOC so as to optimally balance power assist, which is performed when accelerating the vehicle by driving the motor, and energy recouping (regenerative braking), which is performed when decelerating the vehicle.

SOC control is executed to adjust the charging and discharging of a rechargeable battery so that the SOC is in a range of, for example, 50% to 60%. More specifically, charging is performed when the SOC becomes 50% or less, and discharging is performed when the SOC becomes 60% or greater.

For accurate execution of the SOC control the SOC is estimated in the following manner in the prior art.

First, data sets for the terminal voltage V and the charge-discharge current are obtained during a predetermined period Δt (e.g., 60 sec) and stored in a memory. Then, the data sets are used to obtain a primary approximate line (approximate line of the voltage V and current I) by performing statistic processing using the least squares approach. A V intercept of the V-I approximate line is obtained as a non-load voltage Vo.

Next, the polarization voltage Vp at the rechargeable battery is calculated. The calculation may be performed through one of the following two processes. In the first process, a cumulative capacitance Q (i.e., $Q=\int I$) is obtained by cumulating the charge-discharge current I over a predetermined period. Then, the polarization voltage Vp is calculated from a variation amount ΔQ of the cumulative capacitance Q (i.e., the difference between the cumulative capacitance Q obtained during the previous predetermined period and the cumulative capacitance Q obtained during the present predetermined period) and the temperature T of the rechargeable battery (e.g., $-30°$ C.$\leq$T$\leq$$60°$ C.). In the second process, an attenuation amount and generation amount ΔVp of the polarization voltage Vp are calculated with a predetermined calculation expression. Then, the attenuation amount and the generation amount ΔVp are used to calculate the polarization voltage Vp. The polarization voltage Vp is the difference between the theoretical open circuit voltage (OCV) of the rechargeable battery that is determined by the electromotive force Ve and the actual open circuit voltage of the rechargeable battery.

Subsequently, the electromotive force Ve is obtained by subtracting the polarization voltage Vp from the non-load voltage Vo. Then, the SOC is estimated from the electromotive force Ve by referring to a Ve-SOC characteristics table, which is prepared beforehand.

In the prior art SOC control executed for an HEV, the polarization voltage Vp is estimated when the HEV is activated (i.e., when turning on an ignition switch). During the period from when the HEV is activated to when the engine is started, the rechargeable battery is assumed to be in a charge-discharged state (hereinafter referred to as the "battery-current state"). Accordingly, in the prior art, the polarization voltage Vp is calculated under the assumption that the rechargeable battery is in the battery-current state. Japanese Laid-Open Patent Publication No. 2003-197275 describes such a prior art approach for calculating the polarization voltage Vp.

However, the inventors of the present invention have found that the rechargeable battery is continuously in a no-battery-current state, in which the rechargeable battery does not perform charging or discharging, over a rather long time when the crankshaft is not rotating such as during the period from when the HEV is activated to when the engine is started. The inventors have also found that such a no-battery-current state continues over a rather long time from when the engine is stopped after parking the HEV, which has been driven.

In the battery-current state, the charging and discharging of the rechargeable battery is repeated in a complicated manner. This results in rapid loss of ionic species, which are the cause of the polarization voltage Vp, on an electrode reactive interface and attenuates the polarization voltage Vp at a high speed. In the no-battery-current state, current does not flow to the rechargeable battery. Thus, the ions species on the electrode reactive interface are slowly lost. For this reason, in comparison to the battery-current state, the polarization voltage Vp is attenuated at a significantly lower speed.

Therefore, if the calculation approach described above (i.e., calculation approach assuming the battery-current state) is used when the polarization voltage Vp is in an attenuated state, the polarization voltage Vo is attenuated more than actual. As a result, the calculated polarization voltage Vp, which deviates from the actual state, produces errors in the electromotive force Ve and the SOC estimated value, which are calculated from the polarization voltage Vp.

SUMMARY OF THE INVENTION

The present invention provides a method and apparatus for estimating the SOC of a rechargeable battery, which is installed in an HEV or the like, that accurately estimates the SOC of the rechargeable battery.

One aspect of the present invention is a method for estimating the state of charge of a rechargeable battery. The method includes determining a non-load voltage for the rechargeable battery, determining a no-battery-current state in which a charge-discharge current does not flow in the rechargeable battery, measuring terminal voltage variation amount of the rechargeable battery under the no-batterycurrent state, calculating an attenuation amount of a polarization voltage of the rechargeable battery under the no-battery-current state as a static attenuation amount based on the variation amount, calculating the present polarization voltage of the rechargeable battery with the static attenuation amount, calculating electromotive force of the rechargeable battery by subtracting the present polarization voltage from the non-load voltage, and estimating the state of charge of the rechargeable battery based on the electromotive force.

A further aspect of the present invention is a method for estimating the state of charge of a rechargeable battery. The method includes determining a non-load voltage for the rechargeable battery and determining a no-battery-current state, in which a charge-discharge current does not flow in the rechargeable battery, or a battery-current state, in which the charge-discharge current is flowing. The method further includes measuring terminal voltage variation amount of the rechargeable battery under the no-battery-current state, calculating an attenuation amount of a polarization voltage of the rechargeable battery under the no-battery-current state as a static attenuation amount based on the variation amount, calculating an attenuation amount and a generation amount of the polarization voltage of the rechargeable battery under the battery-current state respectively as a dynamic attenuation amount and a dynamic generation amount, and calculating the present polarization voltage of the rechargeable battery. The present polarization voltage is calculated using the static attenuation amount under the no-battery-current state, or the present polarization voltage is calculated using the dynamic attenuation amount and the dynamic generation amount under the battery-current state. The method also includes calculating electromotive force of the rechargeable battery by subtracting the present polarization voltage from the non-load voltage and estimating the state of charge of the rechargeable battery based on the electromotive force.

Another aspect of the present invention is an apparatus for estimating the state of charge of a rechargeable battery. The apparatus includes a non-load voltage calculator which determines a non-load voltage for the rechargeable battery. A battery-current state determiner determines a no-battery-current state, in which a charge-discharge current does not flow in the rechargeable battery, or a battery-current state, in which the charge-discharge current is flowing. A voltage variation measurement unit measures terminal voltage variation amount of the rechargeable battery under the no-battery-current state. A static attenuation amount calculator calculates an attenuation amount of a polarization voltage of the rechargeable battery under the no-battery-current state as a static attenuation amount based on the variation amount. A dynamic attenuation-generation amount calculator calculates an attenuation amount and a generation amount of the polarization voltage of the rechargeable battery under the battery-current state respectively as a dynamic attenuation amount and a dynamic generation amount. A polarization voltage calculator calculates the present polarization voltage of the rechargeable battery. The present polarization voltage is calculated using the static attenuation amount under the no-battery-current state, or the present polarization voltage is calculated using the dynamic attenuation amount and the dynamic generation amount under the battery-current state. An electromotive force calculator calculates electromotive force of the rechargeable battery by subtracting the present polarization voltage from the non-load voltage. A state of charge estimator estimates the state of charge of the rechargeable battery based on the electromotive force.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a graph showing an approximation line used to obtain the non-load voltage Vo through a statistic process from the data sets of voltage data V(n) and current data I(n);

FIGS. 4A($i$) and 4A($ii$) are graphs showing the variation amount $\Delta V$ of the terminal voltage V of a rechargeable battery in a no-battery-current state;

FIG. 4B is a graph showing the attenuation amount (static attenuation amount $\Delta Vp1$) of the polarization voltage Vp in a no-battery-current state;

DETAILED DESCRIPTION OF THE PREFERRED EMBODIMENTS

A preferred embodiment of the present invention will now be discussed with reference to the drawings.

Figure 1:
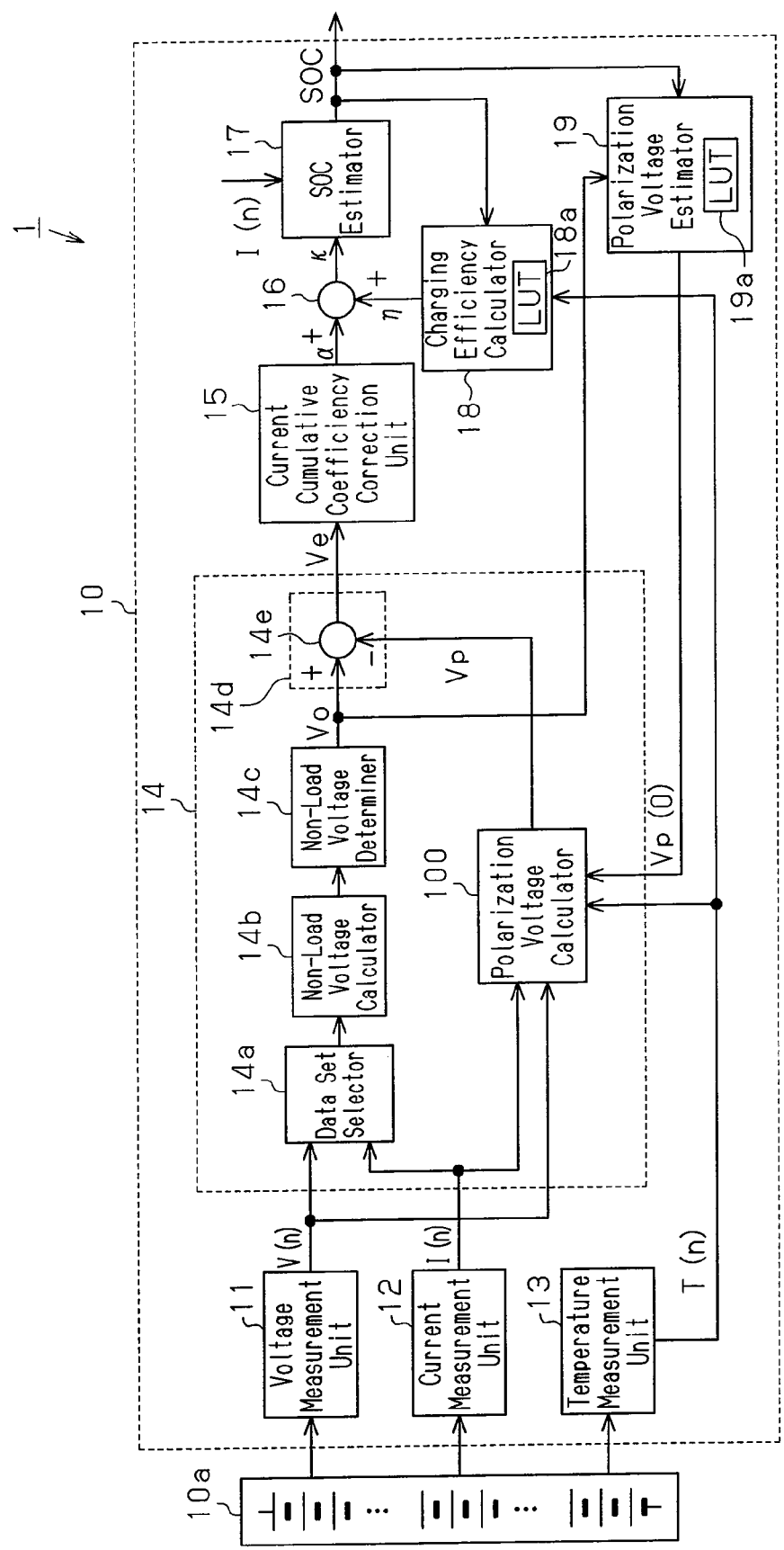
FIG. 1 is a block diagram showing an electrical schematic for a battery pack system in a preferred embodiment of the present invention.

A battery pack system 1 is installed in, for example, a hybrid electric vehicle (HEV). Referring to FIG. 1, the battery pack system 1 includes a rechargeable battery 10a and a battery ECU 10, which serves as state of charge estimation apparatus for estimating the SOC of the rechargeable battery 10a to control the charging and discharging of the rechargeable battery 10a. Normally, to ensure a predetermine output for a motor, the rechargeable battery 10a includes a plurality of battery modules, which are electrically connected in series. Each battery module includes a plurality of battery cells, which are electrically connected in series. Each battery cell is, for example, a nickel-metal hydride battery.

The battery ECU 10 includes a voltage measurement unit 11, a current measurement unit 12, and a temperature measurement unit 13. The voltage measurement unit 11 uses a voltage sensor (not shown) to detect the terminal voltage V of the rechargeable battery 10a in predetermined sampling cycles (e.g., 0.1 sec). The detected terminal voltage V is used as voltage data V(n). Here, "n" represents a sampling number and will be used in the same manner below. The current measurement unit 12 uses a current sensor (not shown) to detect the charge-discharge current I of the rechargeable battery 10a in predetermined sampling cycles (e.g., 0.1 sec). The detected terminal voltage V is used as current data I(n). The current I in the charging direction is represented by a "−" mark, and the current I in the discharging direction is represented by a "+" mark. The temperature measurement unit 13 uses a temperature sensor (not shown) to detect the temperature T of the rechargeable battery 10a in predetermined sampling cycles (e.g., 0.1 sec). The detected temperature T is used as temperature data T(n).

Furthermore, the battery ECU 10 includes an electromotive force calculator 14, a current cumulative coefficient correction unit 15, an adder 16, an SOC estimator 17, a charging efficiency calculator 18, and a polarization voltage estimator 19. The charging efficiency calculator 18 includes a lookup table (LUT) 18a, and the polarization voltage estimator 19 includes a lookup table (LUT) 19a. The electromotive force calculator 14 includes a data set selector 14a, a non-load voltage calculator 14b, a non-load voltage determiner 14c, an electromotive force calculator 14d, and a polarization voltage calculator 100. The electromotive force calculator 14d includes a subtracter 14e. The polarization voltage calculator 100, which is shown in detail in FIG. 2, calculates the polarization voltage Vp.

The data set selector 14a receives plural data sets of the voltage data V(n) and current data I(n) over a predetermined period Δt (e.g., 60 sec). Then, the data set selector 14a selects from the data sets an effective data set S (V(n), I(n)) in accordance with selection conditions. For example, the selection conditions may include the value of the current data I(n) for the charging direction (−) and discharging direction (+) being within a predetermined range (e.g., ±50 A), the sampling number of the current data I(n) in each of the charging and discharging directions being greater than or equal to a predetermined number (e.g., among 60 samples, ten samples for each of the charging and discharging directions), and the variation amount ΔQ of the cumulative capacitance Q obtained from the data sets being within a predetermined range (e.g., 0.3 Ah). A data set S (V(n), I(n)) satisfying all these conditions are determined as being effective. The cumulative capacitance Q is a physical amount obtained by cumulating the charge-discharge current I during the predetermined period Δt. The variation amount ΔQ is the difference between the cumulative capacitance Q(i−1) obtained during the previous predetermined period Δt and the cumulative capacitance Q(i) obtained during the present predetermined period Δt (Q(i)-Q(i−1)).

The effective data set S (V(n), I(n)) selected by the data set selector 14a is provided to the non-load voltage calculator 14b. Referring to FIG. 3, the non-load voltage calculator 14b obtains a primary voltage-current approximate line by performing statistic processing using the least squares approach. Then, the data sets are used to obtain a primary approximate line (approximate line of voltage V-current I) by performing statistic processing using the least squares approach. A V intercept of the V-I approximate line is obtained as a non-load voltage Vo of the rechargeable battery 10a when the charge-discharge current is "0". In the preferred embodiment, the charge-discharge current being "0" does not strictly mean that the charge-discharge current I input to and output from the rechargeable battery 10a is virtually null (zero) but means that the charge-discharge current I statistically corresponds to zero.

The non-load voltage Vo obtained by the calculator 14b is provided to the non-load voltage determiner 14c. The determiner 14c determines whether or not the non-load voltage Vo is effective in accordance with predetermined conditions. For example, the determiner 14c obtains a variance value of the data set S (V(n), I(n)) from the approximate line and determines that the non-load voltage Vo is effective when the variance value is within a predetermined range. Alternatively, the determiner 14c obtains a correlation coefficient of the approximate line and the data set S (V(n), I(n)) and determines that the non-load voltage Vo is effective when the correlation coefficient is greater than or equal to a predetermined value. The non-load voltage Vo that is determined as being effective is provided to the electromotive force calculator 14d.

The polarization voltage calculator 100 receives the voltage data V(n), the current data I(n), and the temperature data T(n) over the predetermined period Δt and calculates the polarization voltage Vp as will be described later.

The electromotive force calculator 14d calculates the electromotive force Ve by subtracting the polarization voltage Vp, which is calculated by the polarization voltage calculator 100, from the non-load voltage Vo, which is determined as being effective by the non-load voltage determiner 14c.

Figure 2:
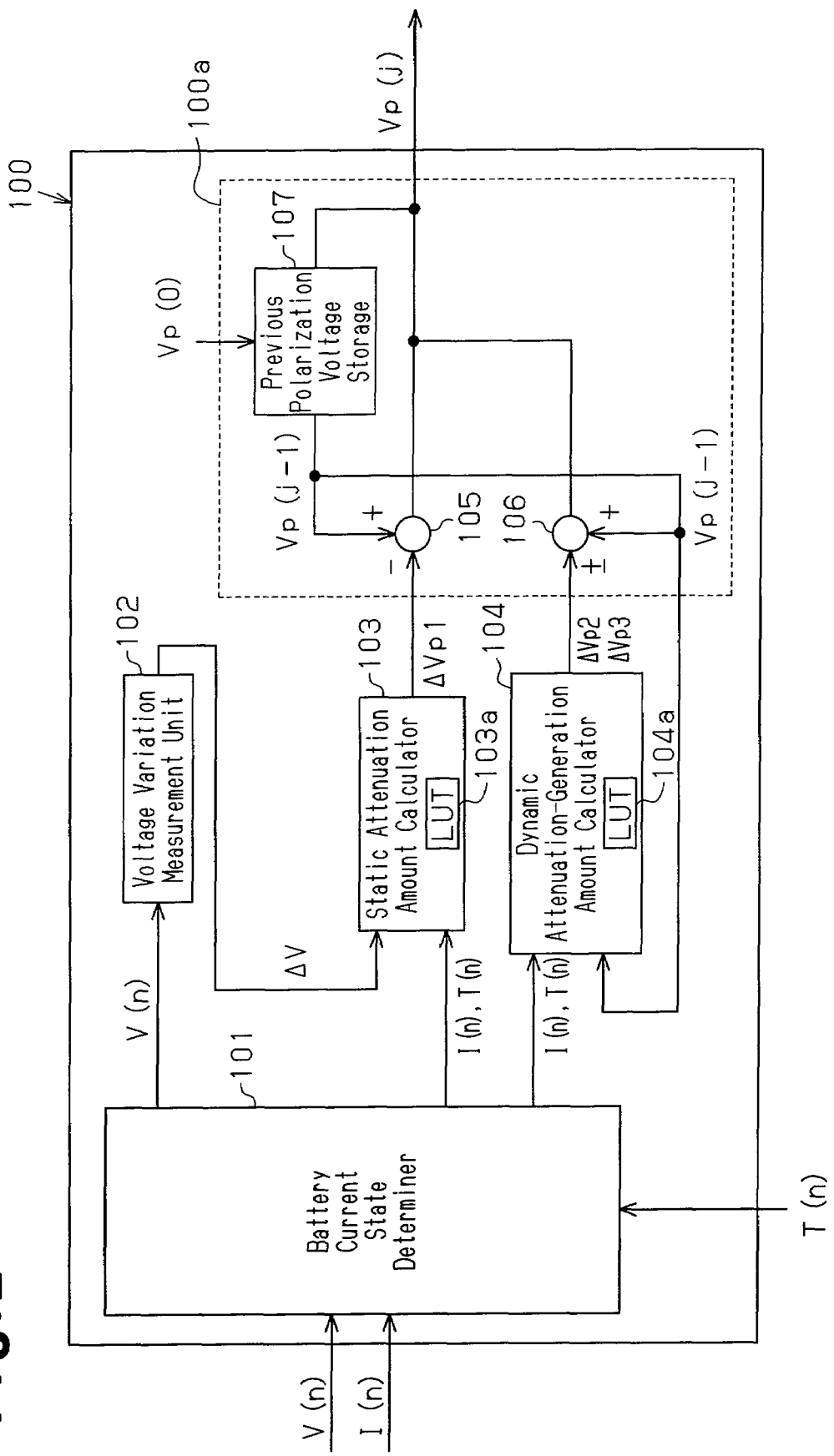
FIG. 2 is a block diagram showing an electrical schematic for a polarization voltage calculator in the preferred embodiment.

Referring to FIG. 2, the polarization voltage calculator 100 includes a battery-current state determiner 101, a voltage variation measurement unit 102, a static attenuation amount calculator 103, a dynamic attenuation-generation amount calculator 104, and a polarization voltage calculator 100a. The static attenuation amount calculator 103 includes a lookup table (LUT) 103a, and the dynamic attenuation-generation amount calculator 104 includes a lookup table (LUT) 104a. The polarization voltage calculator 100a includes a previous polarization voltage storage 107 and two subtracters 105 and 106. The previous polarization voltage storage 107 stores the previous polarization voltage Vp(j−1), which was obtained before the present polarization voltage Vp(j). Here, "j" represents the number of times a control cycle has been performed over the predetermined period Δt and will be used in the same manner below. Thus, the previous polarization voltage Vp(j−1) refers to the polarization voltage calculated one control cycle before the present control cycle. The two subtracters 105 and 106 calculate the present polarization voltage Vp(j).

The battery-current state determiner 101 is provided with the voltage data V(n) from the voltage measurement unit 11, the current data I(n) from the current measurement unit 12, and the temperature data T(n) from the temperature measurement unit 13. The battery-current state determiner 101 determines whether the rechargeable battery 10a is in a no-battery-current state, in which charge-discharge current I does not flow in the rechargeable battery 10a, or a battery-current state, in which charge-discharge current I flows in the rechargeable battery 10a.

The voltage variation measurement unit 102 measures the variation amount ΔV of the terminal voltage V of the rechargeable battery 10a during the predetermined period Δt based on the voltage data V(n) provided from the voltage measurement unit 11. Then, the voltage variation measurement unit 102 provides the variation amount ΔV to the static attenuation amount calculator 103.

The variation amount ΔV of the terminal voltage V will now be discussed with reference to FIG. 4. When the HEV is being driven, the rechargeable battery 10a is in a battery-current state in which charging or discharging is being performed. From this state, when the HEV, which has been driven, is parked and the engine is stopped, the rechargeable battery 10a shifts to a no-battery-current state in which there is no flow of the charge-discharge current I. In this state, charge-discharge current I does not flow in the rechargeable battery 10a, and the electromotive force Ve does not vary. Accordingly, if a control for excessive charging was executed during the control cycle immediately before the stopping of the engine, as shown in FIG. 4A(ii), the terminal voltage V of the rechargeable battery 10a decreases as time t elapses. In this state, the variation amount ΔV of the terminal voltage V of the rechargeable battery 10a, which gradually approaches 0 V, is not affected by the electromotive force Ve and mainly affected by the attenuation of the polarization voltage Vp.

Thus, as shown in FIG. 4B, the attenuation amount of the polarization voltage Vp in the no-battery-current state (static attenuation amount ΔVp1) may be obtained by multiplying the variation amount ΔV by a correction coefficient Ka, which is in accordance with a self-discharge amount that is dependent on the temperature T of the rechargeable battery 10a. The attenuation of the polarization voltage Vp shown in FIG. 4B indicates that the rechargeable battery 10a is in a state of charge polarization. In this case, the polarization voltage Vp gradually approaches 0 V as time elapses from an upward direction (+) toward a downward direction (−) as viewed in FIG. 4B. The correction coefficient Ka is calculated in accordance with a self-discharge amount that is dependent on the temperature T of the rechargeable battery 10a. For example, the correction coefficient Ka is calculated from a map, which is stored on the LUT 103a of the static attenuation amount calculator 103, indicating the relationship between the correction coefficient Ka and the temperature T of the rechargeable battery 10a. The map is obtained beforehand through experiments. When the rechargeable battery 10a is in a state of discharge polarization, the polarization voltage Vp gradually approaches 0 V as time elapses from a downward direction (−) toward an upward direction (+) as viewed in FIG. 4B.

Returning to FIG. 2, the static attenuation amount calculator 103 is provided with the current data I(n) and the temperature data T(n) from the battery-current state determiner 101 and the variation amount ΔV from the voltage variation measurement unit 102. Then, as described above, the static attenuation amount calculator 103 calculates the attenuation amount of the polarization voltage Vp as the static attenuation amount ΔVp1.

The dynamic attenuation-generation amount calculator 104 of the polarization voltage calculator 100 is provided with the current data I(n) and temperature data T(n) from the battery-current state determiner 101. The calculator 104 calculates the attenuation amount of the polarization voltage Vp in a battery-current state as a dynamic attenuation amount ΔVp2 and the generation amount of the polarization voltage Vp in the battery-current state as a dynamic generation amount ΔVp2. The dynamic attenuation amount ΔVp2 is calculated based on, for example, a map stored on the LUT 104a of the calculator 104 and indicating the relationship of the attenuation coefficient Kb, the variation amount ΔQ of the cumulative capacitance during a predetermined period ΔT (e.g., 60 sec), and the temperature T of the rechargeable battery 10a. The calculator 104 determines which one of charge polarization and discharge polarization is mainly being generated in a battery-current state in accordance with whether the rechargeable battery 10a is excessively charged or excessively discharged in each predetermined period ΔT (control cycle). Then, the calculator 104 calculates the polarization voltage Vpa in accordance with the polarization attenuation state. The polarization voltage Vpa (estimated value) is calculated based on, for example, a map stored on the LUT 104a of the calculator 104 and indicating the relationship of the polarization voltage Vpa, the variation amount ΔQ of the cumulative capacitance, and the temperature T of the rechargeable battery 10a. The calculator 104 obtains the dynamic attenuation amount ΔVp2 using equation 3, which will be discussed later. The maps may each be obtained beforehand through experiments. Further, the calculator 104 may obtain the dynamic generation amount ΔVp3 using equation 3a, which will be described later, based on a polarization voltage generation coefficient h, which will be described later, and a cumulative capacitance Q over the predetermined period ΔT (e.g., 60 sec).

The previous polarization voltage Vp(j−1) stored in the storage 107 is provided to the calculator 104 and the subtracters 105 and 106 of the polarization voltage calculator 100a. Further, the subtracter 105 is provided with the static attenuation amount ΔVp1 from the calculator 103, and the subtracter 106 is provided with the dynamic attenuation amount ΔVp2 and the dynamic attenuation amount ΔVo3 from the calculator 104. The subtracter 105 subtracts the static attenuation amount ΔVp1 from the previous polarization voltage Vp(j−1) to obtain the present polarization voltage Vp(j). The subtracter 106 subtracts the dynamic attenuation amount ΔVp2 from the previous polarization voltage Vp(j−1) to obtain the present polarization voltage Vp(j). In this manner, the present polarization voltage Vp(j) is calculated by the subtracter 105 or the subtracter 106 and provided to the electromotive force calculator 14d (subtracter 14e). In the preferred embodiment, the attenuation amounts provided to the subtracters 105 and 106 (i.e., the static attenuation amount ΔVp1 and the dynamic attenuation amount ΔVp2) are marked with a "+" (plus) for a charge polarization and a "−" (minus) for a discharge polarization.

The electromotive force calculator 14d (subtracter 14e) subtracts the polarization voltage Vp(j), which is output from the polarization voltage calculator 100, from the effective non-load voltage Vo, which is output from the non-load voltage determiner 14c, to calculate the electromotive force Ve (i.e., Ve=Vo−Vp(j)).

The electromotive force Ve calculated by the electromotive force calculator 14d (electromotive force calculator 14) is provided to the current cumulative coefficient correction unit 15. The correction unit 15 determines a correction amount α, which is for obtaining a current cumulative coefficient κ in accordance with the electromotive force Ve. The correction amount a is expressed as a linear expression with respect to the electromotive force Ve, and the linear expression is determined taking into consideration the convergence of the system. The adder 16 adds a charging efficiency η, which is output from the charging efficiency calculator 18, to the correction amount α, which is determined by the correction unit 15, to obtain the current cumulative coefficient κ.

The current cumulative coefficient κ is provided to the SOC estimator 17. The SOC estimator 17 multiplies the current data I(n), which is output from the current measurement unit 12, by the current cumulative coefficient κ and cumulates the current over the predetermined period Δt to estimate the SOC.

An SOC estimated value is provided to the charging efficiency calculator 18 and the polarization voltage estimator 19. The calculator 18 calculates the charging efficiency η based on the temperature data T(n) measured by the temperature measurement unit 13 from a characteristic curve of the charging efficiency η, which uses the temperature T as a parameter for the SOC estimated value. The characteristic curve of the charging efficiency η is stored on the LUT 18a. The charging efficiency η is fixed to 1 when the battery pack system 1 is in a discharged state. When the battery pack system 1 is in a charged state, the charging efficiency η calculated by the charging efficiency calculator 18 is used.

The polarization voltage estimator 19 estimates (calculates) the present electromotive force Ve from the present (or initial) SOC estimated value based on the relationship between the SOC estimated value and electromotive force Ve stored on the LUT 19a to calculate an initial value Vp(0) of the polarization voltage Vp(j) by subtracting the electromotive force Ve from the non-load voltage Vo. The initial value Vp(0) is temporarily stored in the previous polarization voltage storage 107 in the same manner as the other polarization voltages Vp(j) (J>0) and then provided to the two subtracters 105 and 106 as described above.

Figure 5:
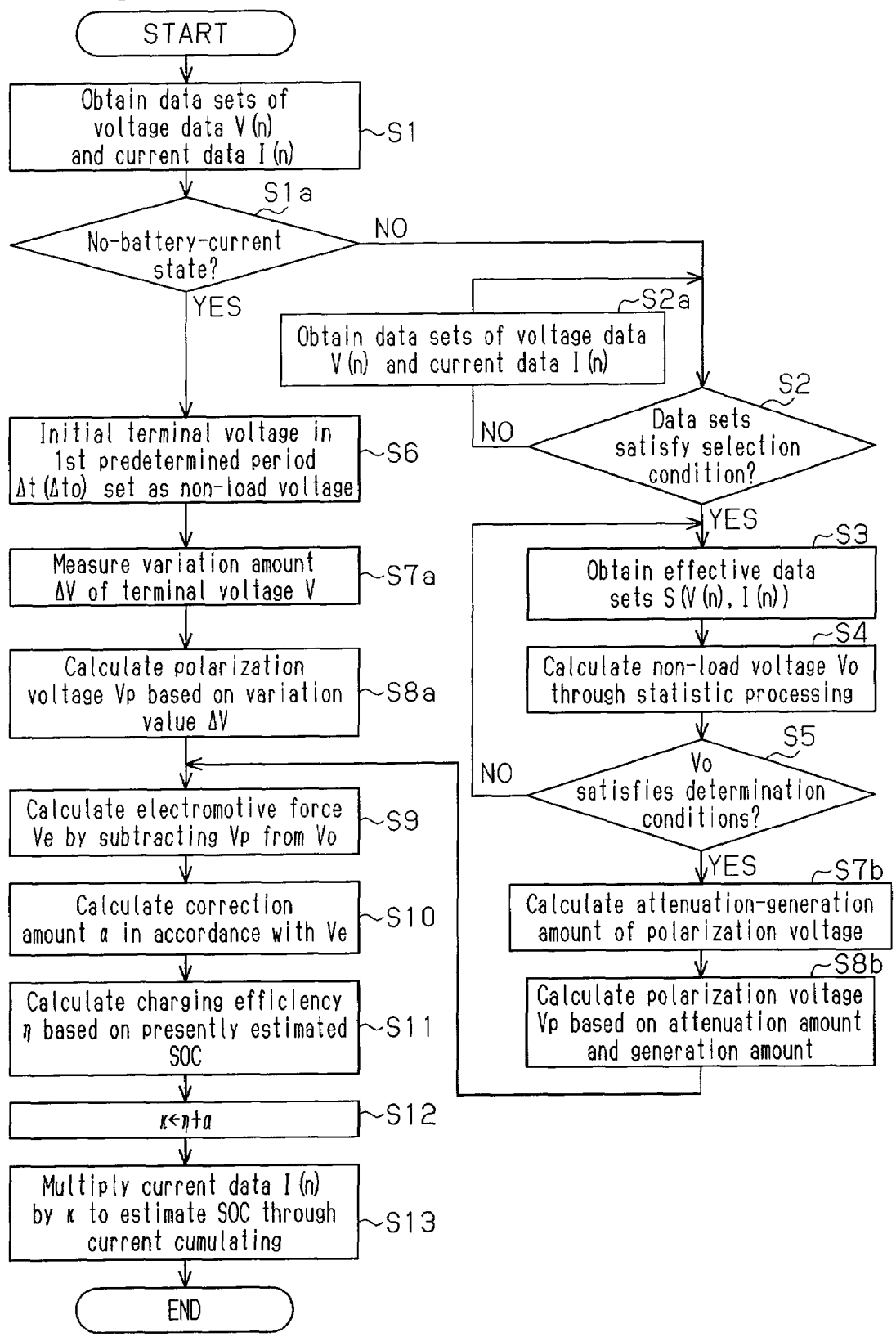
FIG. 5 is a flowchart showing the procedures for estimating the SOC of the rechargeable battery.

The procedures for performing SOC estimation with the battery pack system 1 will now be discussed with reference to FIG. 5.

First, in step S1, data sets of the voltage data V(n) and the current data (n) are obtained as described above.

Then, in step S1a, it is determined whether the rechargeable battery 10a is in a no-battery-current state or a battery-current state (battery-current state determination step). More specifically, the battery-current state determiner 101 determines whether or not the current data I8N) provided from the current measurement unit 12 during a single control cycle of the predetermined period Δt (here 60 sec) is constantly in the vicinity of 0 A (e.g., −1 A<I(n)<1 A). If the current data I(n) is constantly in the vicinity of 0 A during the predetermined period Δt, the rechargeable battery 10a is determined as being in a no-battery-current state. Otherwise the rechargeable battery 10a is determined as being in a battery-current state. The control (SOC estimation) executed in the no-battery-current state is performed after time $\Delta t_0$ (here 60 sec) elapses from when the rechargeable battery 10a shifts from a battery-current state to a no-battery-current state.

When determined that the rechargeable battery 10a is in a no-battery-current state (YES in step S1a), the processing proceeds to step S6. When determined that the rechargeable battery 10a is in a battery-current state (NO in step S1a), the processing proceeds to step S2.

In step S2, to check whether or not the data sets are effective, it is determined whether the data sets of the voltage data V(n) and current data I(n) obtained in step S1 satisfy the selection conditions described above.

When the selection conditions are not satisfied (NO in step S2), in step S2a, the data sets of the voltage data V(n) and current data I(n) are obtained again. Then, the processing proceeds to step S2. When the selection conditions are satisfied (YES in step S2), in step S3, a plurality of effective data sets S(V(n), I(n)) are obtained (e.g., among 60 samples, 10 samples in the charging direction and 10 sample in the discharging direction).

Next, in step S4, a primary voltage-current line (voltage V-current I approximate line) is obtained by performing statistic processing using the least squares approach, as described above, and a V intercept of the V-I approximate line is obtained as a non-load voltage Vo (non-load voltage calculation step).

In step S5, the determiner 14c determines whether the non-load voltage Vo is effective in accordance with determination conditions. If the determination conditions are not satisfied (NO is step S5), the processing returns to step S3 in which a plurality of effective data sets S(V(n), I(n)) are obtained (e.g., among 60 samples, 10 samples in the charging direction and 10 sample in the discharging direction). Then, steps S4 and S5 are repeated. When the non-load voltage Vo satisfies the determination conditions (YES in step S5), the non-load voltage Vo is used to calculate the electromotive force Ve in the subsequent steps.

In step S6, since the rechargeable battery 10a is in a no-battery-current state, the initial terminal voltage V in the first predetermined period Δt ($\Delta t_0$) is determined to be the non-load voltage Vo.

In following step S7a, the variation amount ΔV of the terminal voltage V of the rechargeable battery 10a is measured (voltage variation measurement step). More specifically, in the no-battery-current state, the voltage variation measurement unit 102 measures the variation amount ΔV over the predetermined period Δt, which is shown in FIG. 4A, based on the voltage data V(n) provided from the voltage measurement unit 11.

In step S8a, the static attenuation amount calculator 103 calculates the static attenuation amount ΔVp1 using equation 1, which is shown below (static attenuation amount calculation step).

$$\Delta Vp1 = \Delta V \cdot \text{correction coefficient } Ka \qquad \text{(equation 1)}$$

As described above, the correction coefficient Ka is determined in accordance with the self-discharge amount that is dependent on the temperature T of the rechargeable battery 10a.

Further, in step S8a, the calculator 103 calculates the polarization voltage Vo using the static attenuation amount ΔVp1 (polarization voltage calculation step). More specifically, the polarization voltage Vp is calculated using equation 2, which is shown below, based on the operations of the subtracters 105 and 106 and the previous polarization voltage storage 107. Then, the processing proceeds to step S9.

$$\text{present polarization voltage } Vp(j) = \text{previous polarization voltage } Vp(j-1) - \Delta Vp1 \qquad \text{(equation 2)}$$

In the equation, j represents the control cycle. The initial Vp(0) of the polarization voltage Vp(j) is calculated as described above.

In step S7b (dynamic attenuation-generation amount calculation step), the attenuation amount of the polarization voltage Vp in a battery-current state is calculated. More specifically, the calculator 104 (FIG. 2) calculates the attenuation amount of the polarization voltage in the battery-current state as the dynamic attenuation amount ΔVp2 using equation 3.

$$\Delta Vp2 = \text{polarization voltage } Vpa \cdot \text{attenuation coefficient } kb \qquad \text{(equation 3)}$$

The attenuation coefficient Kb, which is determined assuming that the rechargeable battery 10a is in a battery-current state (charge-discharged state), is determined in accordance with the cumulative capacitance Q of the charge-discharge current I and the temperature T of the rechargeable battery 10a. For example, the attenuation coefficient Kb is obtained from a map stored on the LUT 104a of the calculator 104 indicating the relationship of the attenuation coefficient Kb, the cumulative capacitance Q of the charge-discharge current I, and the temperature T of the rechargeable battery 10a.

Further, in step S7b (dynamic attenuation-generation amount calculation step), the calculator 104 calculates the generation amount of the polarization voltage in the battery-current state as the dynamic attenuation amount ΔVp3 using equation 3a, which is shown below. In this manner, the dynamic generation amount ΔVp3 of a single control cycle is obtained by multiplying the cumulative amount of the charge-discharge current I by the coefficient h. Further, the dynamic generation amount ΔVp3 is limited to a certain value.

$$\Delta Vp3 = h \cdot \int I \qquad \text{(equation 3a)}$$

In the equation, h represents a polarization voltage generation coefficient calculated from a function f(T), which is obtained beforehand through experiments or the like using the temperature T of the rechargeable battery 10a as a parameter. Further, ∫I represents the current cumulative value of the current data I(n), that is, the cumulative capacitance Q.

Then, in step S8b, the polarization voltage Vp is calculated based on the dynamic attenuation amount ΔVp2 and the dynamic generation amount ΔVp3 (polarization voltage calculation step). More specifically, the calculator 100a (FIG. 2)

calculates the polarization voltage Vp using equation 4, which is shown below. Then, the processing proceeds to step S9.

present polarization voltage $Vp(j)$=previous polarization voltage $Vp(j-1)-\Delta Vp2+\Delta Vp3$ (equation 4)

Figure 6:
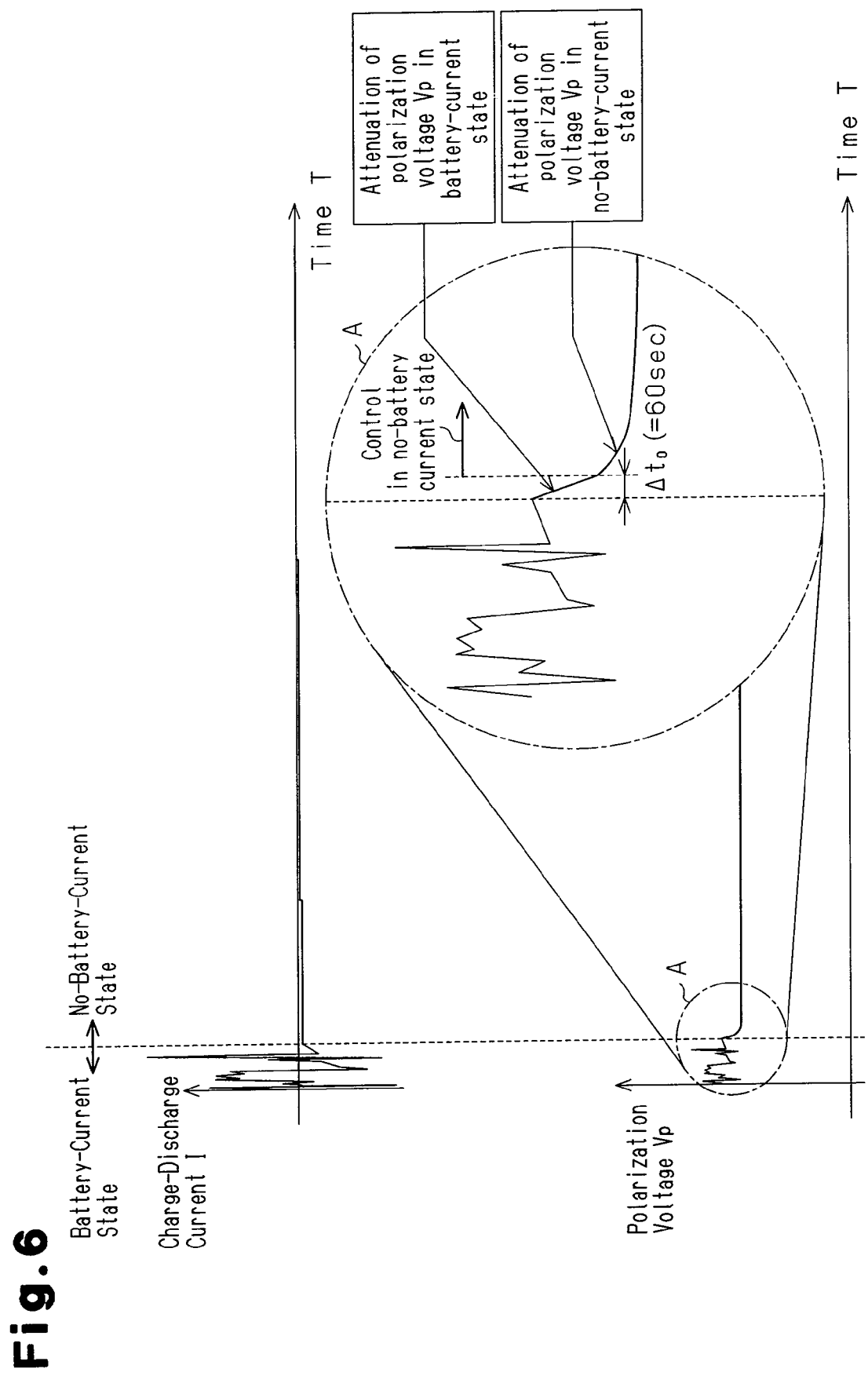
FIG. 6 is a graph showing the attenuation of the polarization voltage Vp in a no-battery-current state (in which the encircled section A is enlarged).

Referring to FIG. 6, in the no-battery-current state, the charge-discharge current I does not flow in the rechargeable battery 10a. In the first predetermined period Δto (60 sec) from when the rechargeable battery 10a shifts to the no-battery-current state, that is, in the first control cycle, the calculated polarization voltage Vp drastically decreases in accordance with the dynamic attenuation amount ΔVp2 and the dynamic generation amount ΔVp3. However, after the predetermined period Δto, the polarization voltage Vp gradually decrease in accordance with the static attenuation amount ΔVp1.

In a typical rechargeable battery including a positive electrode, a negative electrode, a separator, and an electrolytic solution, the charging and discharging of the rechargeable battery is repeated in a battery-current state. This results in rapid loss of ionic species, which are the cause of the polarization voltage Vp, on an electrode reactive interface. Accordingly, the polarization voltage Vp is attenuated at a high speed. In the no-battery-current state, current does not flow to the rechargeable battery. Thus, the ions species on the electrode reactive interface are slowly lost. For this reason, in comparison to the battery-current state, the polarization voltage Vp is attenuated at a significantly lower speed. Accordingly, in the no-battery-current state, when the polarization voltage Vp is calculated using the dynamic attenuation amount ΔVp2, which is calculated using equation 3 (step 7b), the polarization voltage Vp attenuates excessively as compared to when using the static attenuation amount ΔVp1. As a result, the calculated polarization voltage Vp becomes deviated from the actual state. This may produce an error in the electromotive force Ve and SOC estimated value, which are calculated in subsequent steps.

In step S9, the polarization voltage Vp, which is obtained in step S8a or step S8b, is subtracted from the effective non-load voltage Vo to obtain the electromotive force Ve (electromotive force calculation step). In this case, if the polarization voltage Vp is generated in the charging direction, the calculated electromotive force Ve is greater than the actual value, and if the polarization voltage Vp is generated in the discharging direction, the calculated electromotive force Ve is less than the actual value.

In step S10, the correction amount a for obtaining the current cumulative coefficient K is calculated from the present SOC estimated value based on the measured temperature data T(n). Then, in step S11, the charging efficiency η is calculated from the present SOC estimated value based on the measured temperature data. In step S12, the correction amount α calculated in step S10 is added to the charging efficiency η calculated in step S11 to calculate the current cumulative coefficient κ. Finally, in step S13, the current data I(n) is multiplied by the current cumulative coefficient κ to estimate the SOC (state of charge estimation step).

The state of charge estimation apparatus of the preferred embodiment has the advantages described below.

(1) In the no-battery-current state, the charge-discharge current I does not flow in the rechargeable battery 10a and the electromotive force Ve does not vary. In this state, a variation in the terminal voltage V of the rechargeable battery 10a is mainly caused by attenuation of the polarization voltage Vp. Accordingly, the polarization voltage Vp in a no-battery-current state is calculated based on the variation amount ΔV of the terminal voltage V. Therefore, the calculated polarization voltage Vp, which is not excessively attenuated, approaches the actual polarization voltage value in a no-battery-current state. As a result, the electromotive force Ve is accurately calculated, and the SOC is accurately estimated. Preferably, the attenuation amount of the polarization voltage Vp in the no-current-state is calculated as the static attenuation amount ΔVp1 based on the variation amount ΔV of the terminal voltage V of the rechargeable battery 10a, and the polarization voltage Vp is calculated based on the static attenuation amount ΔVp1. By using such dynamic attenuation amount ΔVp1, the polarization voltage in the no-battery-current state is accurately calculated.

(2) The static attenuation amount ΔVp1 is calculated using the equation of ΔVp1=ΔV·correction coefficient Ka. The polarization voltage Vp is calculated using the equation of present polarization voltage Vp(j)=previous polarization voltage Vp(j−1)−ΔVp1. By using such equations, the polarization voltage Vp in the no-battery-current state is accurately calculated.

(3) The correction coefficient Ka, which is used to calculate the static attenuation amount ΔVp1 in the no-battery-current state, is determined in accordance with the self-discharge amount that is dependent on the temperature T of the rechargeable battery 10a. This accurately calculates the static attenuation amount ΔVp1, which is used to obtain the polarization voltage Vp.

(4) The dynamic attenuation amount ΔVp2 is calculated using the equation of ΔVp2 polarization voltage Vpa·attenuation coefficient Kb, and the dynamic generation amount ΔVp3 is calculated using the equation of ΔVp3=h·∫I. Further, the polarization voltage Vp in the battery-current state is calculated using the equation of present polarization voltage Vp(j)=previous polarization voltage Vp(j−1)−ΔVp2+ΔVp3. Accordingly, in the rechargeable battery 10a, the battery-current state and the no-battery-current state are clearly distinguished, and the polarization voltage Vp in the battery-current state is accurately calculated.

(5) The attenuation coefficient Kb, which is used to calculate the dynamic attenuation amount ΔVp2 in the battery-current state, is determined in accordance with the cumulative capacitance Q of the charge-discharge current I flowing in the rechargeable battery 10a and the temperature T of the rechargeable battery 10a. This accurately calculates the dynamic attenuation amount ΔVp2, which is used to obtain the polarization voltage Vp.

It should be apparent to those skilled in the art that the present invention may be embodied in many other specific forms without departing from the spirit or scope of the invention. Particularly, it should be understood that the present invention may be embodied in the following forms.

The illustrated embodiment is for a no-battery-current state that occurs after the HEV, which has been traveling, is parked and the engine is stopped. However, the present invention is not limited in such a manner and may be applied to a period in which the crankshaft is not rotating and a no-battery-state occurs, such as from when the HEV is activated to when the engine is started. In the latter case, the no-battery-current state continues from when starting the estimation of the polarization voltage (i.e., when the ignition switch is turned on). Accordingly, in comparison with the former case (refer to FIG. 6), the attenuation of the polarization voltage Vp is more gradual.

In the illustrated embodiment, a single control cycle is set as the predetermined period Δt (60 sec). However, the present invention is not limited in such a manner, and a single control cycle may be set to any value within 10 minutes (600 sec) as long as the calculated polarization voltage Vp is not excessively attenuated.

In the illustrated embodiment, the correction coefficient Ka is determined in accordance with the self-discharge amount, which is dependent on the temperature T of the rechargeable battery 10a. However, the present invention is not limited in such a manner, and the correction coefficient Ka may be determined in accordance with the cumulative capacitance Q, the temperature T of the rechargeable battery 10a, and the previous polarization voltage Vp(j−1).

In the illustrated embodiment, the electromotive force Ve output from the electromotive force calculator 14 is provided to the current cumulative coefficient correction unit 15 without any corrections. However, the present invention is not limited in such a manner, and the electromotive force Ve output from the electromotive force calculator 14 may be corrected. For example, when the variation amount ΔVe of the electromotive force Ve for each single control cycle exceeds a predetermined limit value Vt, the electromotive force Ve may be corrected so that the variation amount ΔVe becomes less than the limit value Vt. More specifically, when the polarization voltage of the rechargeable battery 10a is at the charge polarization side and the variation amount ΔVe exceeds the limit value Vt, the present electromotive force Ve may be set to, for example, the previous electromotive force Ve+Vt. Further, when the polarization voltage of the rechargeable battery 10a is at the discharge polarization side and the variation amount ΔVe is less than the limit value Vt, the present electromotive force Ve may be set to, for example, the previous electromotive force Ve−Vt.

In the preferred embodiment, the battery pack system 1 is used in a hybrid electric vehicle (HEV). However, the present invention may also be applied to a pure electric vehicle (PEV).

In the preferred embodiment, the present invention is applied to the battery pack system 1, which includes a nickel-metal hydride (NiMH) battery. However, the present invention may be applied to other batteries, such as a battery pack system including a lithium-ion battery, a lithium metal battery, or a nickel-zinc battery by way of illustrative, non-limiting examples.

The present examples and embodiments are to be considered as illustrative and not restrictive, and the invention is not to be limited to the details given herein, but may be modified within the scope and equivalence of the appended claims.

What is claimed is:

1. A method for estimating the state of charge of a rechargeable battery, the method comprising:
    determining a non-load voltage for the rechargeable battery;
    determining a no-battery-current state in which a charge-discharge current does not flow in the rechargeable battery;
    measuring terminal voltage variation amount of the rechargeable battery under the no-battery-current state;
    calculating an attenuation amount of a polarization voltage of the rechargeable battery under the no-battery-current state as a static attenuation amount based on the variation amount;
    calculating the present polarization voltage of the rechargeable battery with the static attenuation amount;
    calculating electromotive force of the rechargeable battery by subtracting the present polarization voltage from the non-load voltage; and
    estimating the state of charge of the rechargeable battery based on the electromotive force.

2. The method according to claim 1, wherein said calculating the present polarization voltage includes:
    calculating the static attenuation amount $\Delta Vp1$ under the no-battery-current state from following equation 1:
        $\Delta Vp1 = \Delta V \cdot Ka$ ... (equation 1), where $\Delta V$ represents the variation amount, and Ka represents a correction coefficient of the variation amount; and
    calculating the present polarization voltage Vp(j) under the no-battery-current state from following equation 2:
        $Vp(j) = Vp(j-1) - \Delta Vp1$ ... (equation 2), where $Vp(j-1)$ represents the previously calculated polarization voltage.

3. The method according to claim 2, wherein the correction coefficient Ka is determined in accordance with a self-discharge amount that is dependent on the temperature of the rechargeable battery.

4. A method for estimating the state of charge of a rechargeable battery, the method comprising:
    determining a non-load voltage for the rechargeable battery;
    determining a no-battery-current state, in which a charge-discharge current does not flow in the rechargeable battery, or a battery-current state, in which the charge-discharge current is flowing;
    measuring terminal voltage variation amount of the rechargeable battery under the no-battery-current state;
    calculating an attenuation amount of a polarization voltage of the rechargeable battery under the no-battery-current state as a static attenuation amount based on the variation amount;
    calculating an attenuation amount and a generation amount of the polarization voltage of the rechargeable battery under the battery-current state respectively as a dynamic attenuation amount and a dynamic generation amount;
    calculating the present polarization voltage of the rechargeable battery, in which the present polarization voltage is calculated using the static attenuation amount under the no-battery-current state, or the present polarization voltage is calculated using the dynamic attenuation amount and the dynamic generation amount under the battery-current state;
    calculating electromotive force of the rechargeable battery by subtracting the present polarization voltage from the non-load voltage; and
    estimating the state of charge of the rechargeable battery based on the electromotive force.

5. The method according to claim 4, wherein said calculating the present polarization voltage includes:
    calculating the static attenuation amount $\Delta Vp1$ under the no-battery-current state from following equation 1:
        $\Delta Vp1 = \Delta V \cdot Ka$ ... (equation 1), where $\Delta V$ represents the variation amount, and Ka represents a correction coefficient of the variation amount; and
    calculating the present polarization voltage Vp(j) under the no-battery-current state from following equation 2:
        $Vp(j) = Vp(j-1) - \Delta Vp1$ ... (equation 2), where $Vp(j-1)$ represents the previously calculated polarization voltage.

6. The method according to claim 5, wherein the correction coefficient Ka is determined in accordance with a self-discharge amount that is dependent on the temperature of the rechargeable battery.

7. The method according to claim 5, wherein said calculating the present polarization voltage includes:
    calculating the dynamic attenuation amount $\Delta Vp2$ under the battery-current state from following equation 3:

$\Delta Vp2 = Vpa \cdot Kb$ ... (equation 3), where Vpa represents an estimated value of the polarization voltage that is determined from the temperature of the rechargeable battery and the variation amount of a cumulative capacitance of the charge-discharge current, and Kb represents an attenuation coefficient;

calculating the dynamic generation amount $\Delta Vp3$ under the battery-current state from following equation 3:

$\Delta Vp3 = h \cdot \int I$ ... (equation 3a), where h represents a polarization voltage generation coefficient, and $\int I$ represents the cumulative capacitance of the charge-discharge current;

calculating the present polarization voltage Vp(j) under the battery-current state from following equation 4:

$Vp(j) = Vp(j-1) - \Delta Vp2 + \Delta Vp3$ ... (equation 4), where Vp(j-1) represents the previously calculated polarization voltage.

8. The method according to claim 7, wherein the attenuation coefficient Kb is determined based on the cumulative capacitance of the charge-discharge current and the temperature of the rechargeable battery.

9. An apparatus for estimating the state of charge of a rechargeable battery, the apparatus comprising:

a non-load voltage calculator which determines a non-load voltage for the rechargeable battery;

a battery-current state determiner which determines a no-battery-current state, in which a charge-discharge current does not flow in the rechargeable battery, or a battery-current state, in which the charge-discharge current is flowing;

a voltage variation measurement unit which measures terminal voltage variation amount of the rechargeable battery under the no-battery-current state;

a static attenuation amount calculator which calculates an attenuation amount of a polarization voltage of the rechargeable battery under the no-battery-current state as a static attenuation amount based on the variation amount;

a dynamic attenuation-generation amount calculator which calculates an attenuation amount and a generation amount of the polarization voltage of the rechargeable battery under the battery-current state respectively as a dynamic attenuation amount and a dynamic generation amount;

a polarization voltage calculator which calculates the present polarization voltage of the rechargeable battery, wherein the present polarization voltage is calculated using the static attenuation amount under the no-battery-current state, or the present polarization voltage is calculated using the dynamic attenuation amount and the dynamic generation amount under the battery-current state;

an electromotive force calculator which calculates electromotive force of the rechargeable battery by subtracting the present polarization voltage from the non-load voltage; and a state of charge estimator which estimates the state of charge of the rechargeable battery based on the electromotive force.

\* \* \* \* \*